(12) United States Patent
Wu et al.

(10) Patent No.: US 10,133,134 B2
(45) Date of Patent: Nov. 20, 2018

(54) ARRAY SUBSTRATE AND LIQUID CRYSTAL DISPLAY PANEL

(71) Applicants: Xiamen Tianma Micro-Electronics Co., Ltd., Xiamen (CN); Tianma Micro-Electronics Co., Ltd., Shenzhen (CN)

(72) Inventors: Hao Wu, Xiamen (CN); Qiong Song, Xiamen (CN)

(73) Assignees: Xiamen Tianma Micro-Electronics Co., Ltd., Xiamen (CN); Tianma Micro-Electronics Co., Ltd., Shenzhen (CN)

( * ) Notice: Subject to any disclaimer, the term of this patent is extended or adjusted under 35 U.S.C. 154(b) by 136 days.

(21) Appl. No.: 14/975,552

(22) Filed: Dec. 18, 2015

(65) Prior Publication Data
US 2017/0003559 A1 Jan. 5, 2017

(30) Foreign Application Priority Data
Jun. 30, 2015 (CN) .......................... 2015 1 0375154

(51) Int. Cl.
*G02F 1/1335* (2006.01)
*G02F 1/1362* (2006.01)
(Continued)

(52) U.S. Cl.
CPC ...... *G02F 1/136209* (2013.01); *G02F 1/1368* (2013.01); *G02F 1/133514* (2013.01); *G02F 1/136286* (2013.01); *H01L 27/124* (2013.01)

(58) Field of Classification Search
CPC ............. G02F 1/1343; G02F 1/136209; G02F 1/136286; G02F 1/1368; G02F 1/133514; H01L 27/124
See application file for complete search history.

(56) References Cited

U.S. PATENT DOCUMENTS

| | | | |
|---|---|---|---|
| 2005/0105032 A1* | 5/2005 | Ono | G02F 1/134363 349/139 |
| 2006/0001815 A1* | 1/2006 | Kim | G02F 1/134363 349/141 |

(Continued)

FOREIGN PATENT DOCUMENTS

| | | |
|---|---|---|
| CN | 101398587 A | 4/2009 |
| CN | 202339463 U | 7/2012 |

(Continued)

*Primary Examiner* — Nathanael R Briggs
(74) *Attorney, Agent, or Firm* — Faegre Baker Daniels LLP

(57) ABSTRACT

An array substrate, including: data lines, scan lines intersecting the data lines; and a plurality of pixel regions; where each of the plurality of pixel regions includes first and second light transmission regions and a light shielding region between the first and second light transmission regions, a first electrode is disposed in the first light transmission region, a second electrode is disposed in the second light transmission region, and a thin film transistor is disposed in the light shielding region, where a drain electrode of the thin film transistor is electrically connected with the first electrode and the second electrode; the data line corresponding to each of the plurality of pixel regions includes a first portion and a second portion extending in two different directions, respectively, the first portion is connected with the second portion via a first connection portion located at the light shielding region.

17 Claims, 11 Drawing Sheets

(51) Int. Cl.
*H01L 27/12* (2006.01)
*G02F 1/1368* (2006.01)

(56) References Cited

U.S. PATENT DOCUMENTS

| | | | | |
|---|---|---|---|---|
| 2006/0033871 A1* | 2/2006 | Kim | ............ | G02F 1/134309 349/139 |
| 2007/0242206 A1* | 10/2007 | Yoon | ............ | G02F 1/134363 349/141 |
| 2008/0068549 A1* | 3/2008 | Liao | ............ | G02F 1/134363 349/141 |
| 2008/0204640 A1 | 8/2008 | Wada | | |
| 2009/0103025 A1* | 4/2009 | Tanno | ............ | G02F 1/134363 349/110 |
| 2010/0097555 A1* | 4/2010 | Huang | ............ | G02F 1/134309 349/139 |
| 2014/0152934 A1* | 6/2014 | Huh | ............ | G02F 1/133707 349/43 |

FOREIGN PATENT DOCUMENTS

| | | |
|---|---|---|
| CN | 102959693 A | 3/2013 |
| CN | 103018984 A | 4/2013 |
| CN | 103852942 A | 6/2014 |
| CN | 103913908 A | 7/2014 |
| TW | 200519465 A | 6/2005 |
| WO | 2012070448 A1 | 5/2012 |

\* cited by examiner

ARRAY SUBSTRATE AND LIQUID CRYSTAL DISPLAY PANEL

CROSS-REFERENCE TO RELATED APPLICATION

This application claims priority to Chinese Application No. 201510375154.3, filed Jun. 30, 2015, which is herein incorporated by reference in its entirety.

TECHNICAL FIELD

The present disclosure relates to the field of liquid crystal display technologies and, in particular, to an array substrate and a liquid crystal display panel.

BACKGROUND

In the field of liquid crystal display technologies, an In-Plane Switching (IPS) technology and a Fringe Field Switching (FFS) technology, which are common liquid crystal display technologies for a wide angle of view, are characterized in that a positive electrode and a negative electrode are both disposed on the same substrate such that liquid crystal molecules are rotatable in a plane in parallel with the substrate, thereby increasing the light transmittance of a liquid crystal layer.

Currently, a dual-domain technology is generally used in the IPS and FFS technologies. As shown in FIG. 1 which is a schematic view showing the structure of a pixel electrode employing the dual-domain technology in the related art, an array substrate includes data lines 11, scan lines 12 and a plurality of pixel regions 13 defined by the data lines 11 and the scan lines 12, where a pixel electrode 14 and a thin film transistor 15 are disposed at each of the plurality of pixel regions 13, a gate electrode of the thin film transistor 15 is connected with the scan line 12, a source electrode of the thin film transistor 15 is connected with the data line 11 and a drain electrode of the thin film transistor 15 is connected with the pixel electrode 14. In addition, referring to FIG. 1, the pixel electrode 14 in each pixel region 13 includes two portions, that is, an upper portion A and a lower portion B, and a corner region is formed at the joint between the upper portion A of the pixel electrode 14 and the lower portion B of the pixel electrode 14. As compared with a single-domain technology, the dual-domain technology enables a wider angle of view, thereby satisfying increasing user demands for display quality. However, the dual-domain technology is also defective. For example, effects on liquid crystal molecules located at the joint between the upper portion A of the pixel electrode 14 and the lower portion B of the pixel electrode 14 caused by the upper portion A and the lower portion B counteract each other, so that these liquid crystal molecules rest in place without rotation toward a direction Y, leading to black disclination lines. When a display panel with the array substrate is pressed by an external force, the liquid crystal molecules located at the joint between the upper portion A of the pixel electrode 14 and the lower portion B of the pixel electrode 14 are disordered, and cause adjacent liquid crystal molecules to be arranged like the liquid crystal molecules located at the joint between the upper portions A and B, so that the region including the black disclination lines is enlarged, that is, a trace mura phenomenon occurs, thereby negatively affecting a display effect of the display panel. Moreover, when the external force is removed, due to the disordered arrangement of the liquid crystal molecules located at the joint between the upper portion A of the pixel electrode 14 and the lower portion B of the pixel electrode 14, the recovery directions Y of the liquid crystal molecules conflict, so that the recovery (or return) of the liquid crystal molecules becomes slow, some of the liquid crystal molecules cannot recover to their original states, and hence the trace mura phenomenon remains. In addition, the corner region between the upper portion A of the pixel electrode 14 and the lower portion B of the pixel electrode 14 causes a corner region along the data line 11 in the related art, and the data line 11 is made of light-impermeable material, thereby leading to a light leak phenomenon at the corner region of the data line 11.

SUMMARY

Embodiments of the disclosure provide an array substrate and a liquid crystal display panel to solve technical problems of the influence of the trace mura phenomenon and the light leak phenomenon at the corner region on the display effect.

In a first example, the disclosure provides an array substrate, the array substrate includes data lines, scan lines intersecting the data lines and a plurality of pixel regions; where each of the plurality of pixel regions includes a first light transmission region, a second light transmission region and a light shielding region between the first light transmission region and the second light transmission region, a first electrode is disposed in the first light transmission region, a second electrode is disposed in the second light transmission region, and a thin film transistor is disposed in the light shielding region, where a drain electrode of the thin film transistor is electrically connected with the first electrode and the second electrode; the data line corresponding to each of the plurality of pixel regions include a first portion and a second portion extending in two different directions, respectively, the first portion is connected with the second portion via a first connection portion located at the light shielding region, and the scan line corresponding to each of the plurality of pixel regions extends through the light shielding region.

In a second example, the disclosure provides a liquid crystal display panel including a color filter substrate and an array substrate opposite to the color filter substrate, where the array substrate is any of the above embodiments.

In the array substrate and the liquid crystal display panel, according to embodiments of the disclosure, each pixel region is divided into three regions, that is, a first light transmission region, a second light transmission region and a light shielding region, where a first electrode is disposed in the first light transmission region, a second electrode is disposed in the second light transmission region, a thin film transistor is disposed in the light shielding region, and a drain electrode of the thin film transistor is electrically connected with both the first electrode and the second electrode, such that liquid crystal molecules located at a boundary between the first electrode and the second electrode are within the light shielding region, and the effect of these liquid crystal molecules on the display effect is invisible to a user, thereby effectively reducing the influence of the trace mura on the display effect. Moreover, as compared with the related art in which the thin film transistor and the light shielding region are located at an end of the pixel region, the technical solutions provided by the embodiments of the present invention arrange the thin film transistor and the light shielding region in the middle of the pixel region, without affecting the aperture ratio of the array substrate. In addition, according to the technical solutions provided by the embodiments of the disclosure, there is no significant corner region on the data lines, and hence no light leak phenomenon occurs.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

In order to more clearly illustrate the technical solutions of the embodiments of the disclosure, the drawings used for the description of the embodiments are briefly introduced below. Obviously, the drawings for the following description only show some embodiments of the disclosure, and other drawings may also be obtained from the described drawings.

Figure 1:
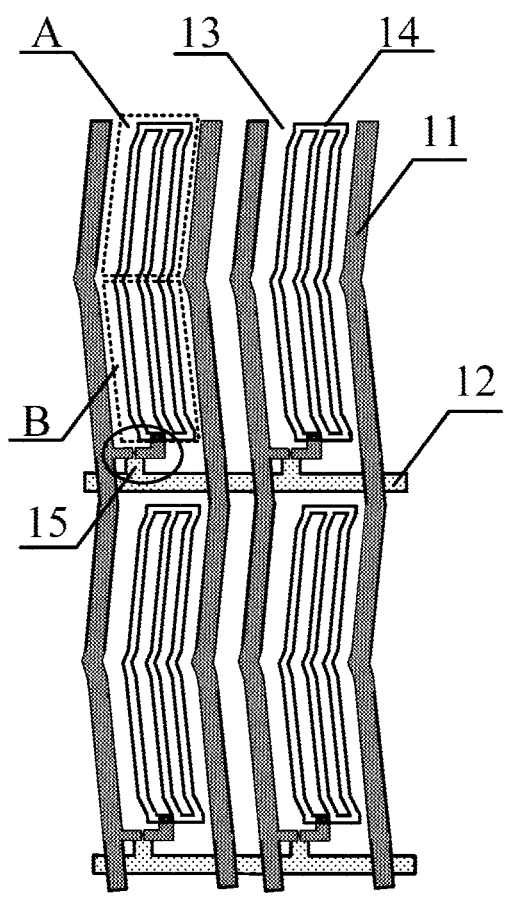
FIG. 1 is a schematic view showing the structure of a pixel electrode employing the dual-domain technology.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be further described in detail below in conjunction with the accompanying drawings and embodiments. It should be noted that the embodiments disclosed herein are merely intended for explaining, rather than limiting, the disclosure. It should also be noted that the accompanying drawings show only parts relating to the disclosure, but not in an exhausting way, for the ease of description.

Figure 2A:
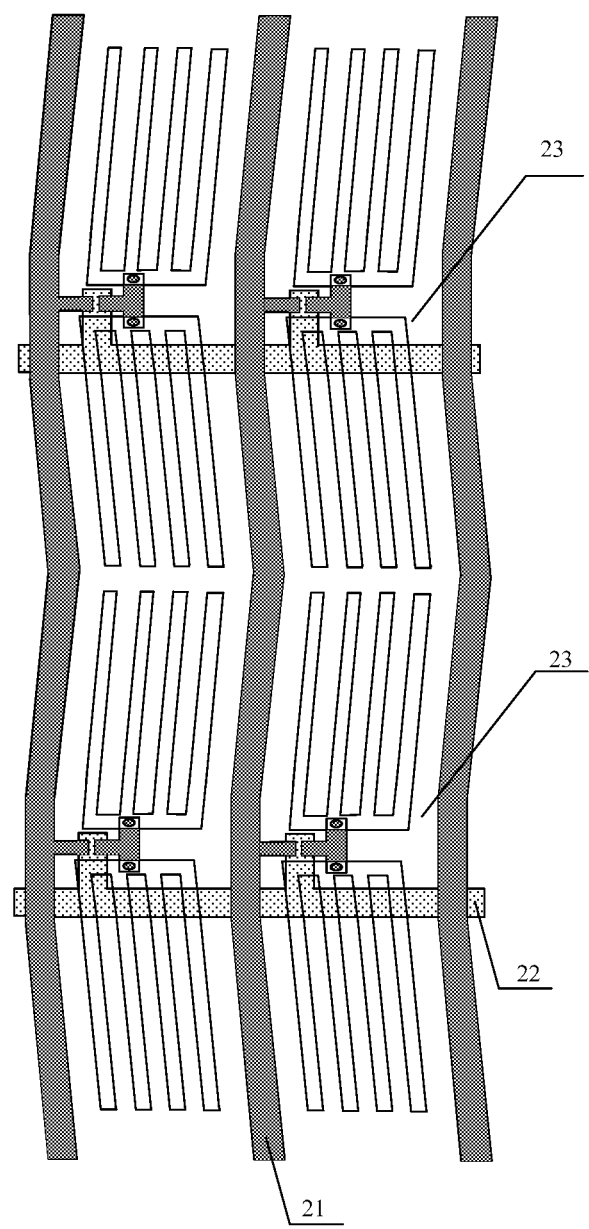
FIG. 2A is a schematic diagram showing the structure of a first array substrate, according to embodiments of the disclosure.
Figure 2B:
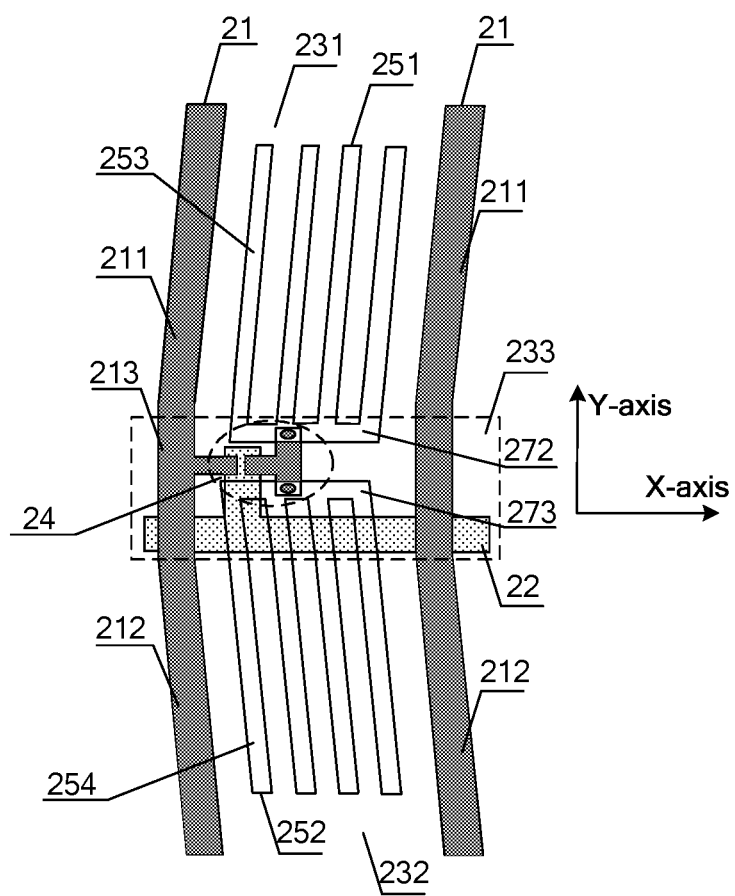
FIG. 2B is a schematic diagram showing the structure of a pixel region in the first array substrate shown in FIG. 2A.

Referring to FIG. 2A which is a schematic diagram showing the structure of a first array substrate, according to embodiments of the disclosure, and FIG. 2B which is a schematic diagram showing the structure of a pixel region in the first array substrate shown in FIG. 2A, the array substrate includes data lines 21, scan lines 22 intersecting with the data lines 21 and a plurality of pixel regions 23.

Each of the plurality of pixel regions 23 includes a first light transmission region 231, a second light transmission region 232, and a light shielding region 233 between the first light transmission region 231 and the second light transmission region 232, where a thin film transistor 24 is disposed in the light shielding region 233, a first electrode 251 is disposed in the first light transmission region 231, a second electrode 252 is disposed in the second light transmission region 232, and a drain electrode of the thin film transistor 24 is electrically connected with both the first electrode 251 and the second electrode 252.

In addition, the data line 21 corresponding to each of the plurality of pixel regions 23 includes a first portion 211 and a second portion 212 which respectively extend in two different directions, the first portion 211 is connected with the second portion 212 via a first connection portion 213 located at the light shielding region 233, and the scan line 22 corresponding to the pixel region 23 extends through the light shielding region 233.

As such, in the array substrate, each pixel region 23 is divided into the first light transmission region 231, the second light transmission region 232 and the light shielding region 233, where the first electrode 251 is disposed in the first light transmission region 231, the second electrode 252 is disposed in the second light transmission region 232, the thin film transistor 24 is disposed in the light shielding region 233, and the drain electrode of the thin film transistor 24 is electrically connected with both the first electrode 251 and the second electrode 252, such that liquid crystal molecules located at a boundary between the first electrode 251 and the second electrode 252 are within the light shielding region 233, and an effect of these liquid crystal molecules on the display effect is invisible to a user, thereby effectively reducing the influence of the trace mura on the display effect. In addition, in the related art, a corner region of the data line is present corresponding to the corner region between the upper portion and the lower portion of the pixel electrode, and the data line is made of light impermeable material, thereby leading to a light leak phenomenon at the corner region of the data line. However, according to the technical solutions provided by embodiments of the disclosure, there is no significant corner region on the data line 21 and the first connection portion 213 of the data line is within the light shielding region 233, thus no light leak phenomenon occurs. Moreover, as compared with the related art in which the thin film transistor and the light shielding region are located at an end of the pixel region, the technical solutions provided by embodiments of the disclosure arrange the thin film transistor 24 and the light shielding region 233 in the middle of the pixel region 23, without affecting the aperture ratio of the array substrate.

Further, in embodiments, the scan line 22 located at the light shielding region 233 extends in a first direction, i.e. a direction X shown in FIG. 2B, and the first portion 211 and the second portion 212 of the data line 21 are symmetric with respect to the first direction.

Still referring to FIG. 2B, the first electrode 251 and the second electrode 252 are also symmetric with respect to the first direction.

In the above embodiments of the disclosure, the first electrode 251 includes at least one first strip electrode 253, the second electrode 252 includes at least one second strip electrode 254, and the first strip electrodes 253 are disposed corresponding to the second strip electrodes 254, respectively. As shown in FIG. 2B, there are four first strip electrodes 253 and four second strip electrodes 254. Further, the first strip electrodes 253 and the second strip electrodes 254 are symmetric with respect to the first direction. In some embodiments, each of the first electrode 251 and the second electrode 252 may include a different number of strip electrodes, such as 1, 2, 3 or 5 strip electrodes, without limitation to 4 strip electrodes.

Figure 3A:
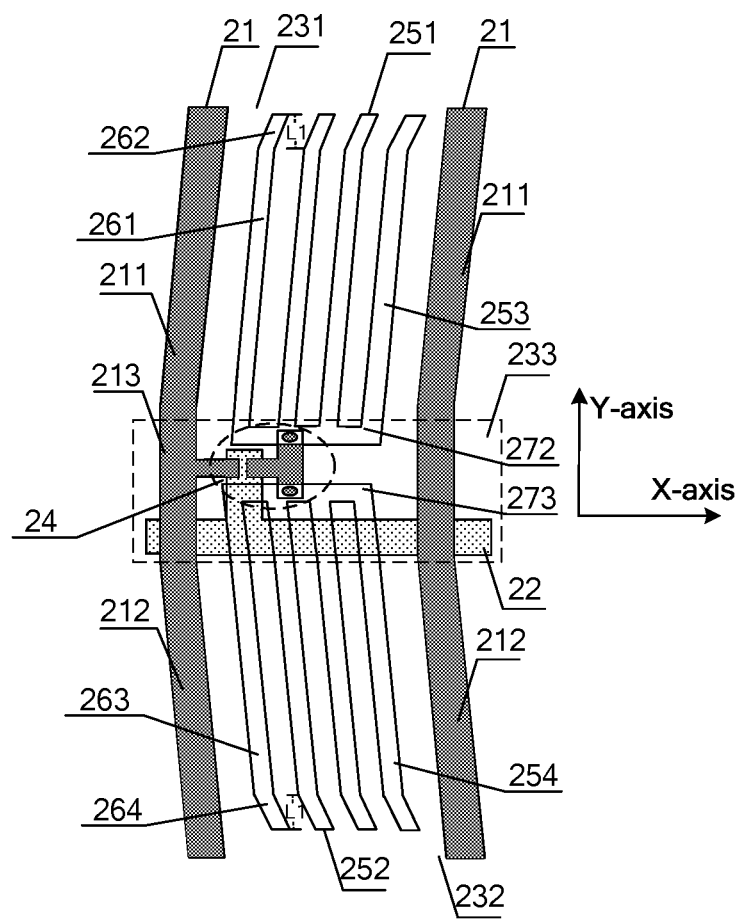
FIG. 3A is a schematic diagram showing the structure of a second array substrate, according to embodiments of the disclosure.

Based on the array substrate shown in FIG. 2A, FIG. 3A shows a schematic diagram of the structure of a second array substrate, according to embodiments of the disclosure, where each first strip electrode 253 includes a first body 261 and a first deflected part 262 inclined at a first angle relative to the first body 261, and the first deflected part 262 is located at an end of the first body 261 that is away from the thin film transistor 24. Likewise, each second strip electrode 254 includes a second body 263 and a second deflected part 264 inclined at a second angle relative to the second body 263, and the second deflected part 264 is located at an end of the second body 263 that is away from the thin film transistor 24. In addition, in embodiments, the black disclination lines are formed mainly at the end of the first strip electrode 253 away from the thin film transistor 24 and the end of the second strip electrode 254 away from the thin film transistor 24 and are likely to extend in a direction Y shown in FIG. 3A, therefore, the first deflected part 262 and the second deflected part 264 are arranged to effectively enhance the intensity of electric fields in the direction Y in peripheral regions located at ends of the pixel region 23 that are away from the thin film transistor 24, so that the black disclination lines are prevented from extending in the direction Y when a press action is performed, thereby further decreasing the influence of the black disclination lines on the display effect and further eliminating the trace mura phenomenon.

In embodiments, the first deflected part 262 and the second deflected part 264 each have a length L1 in the direction Y, as shown in FIG. 3A, and the length, which is also referred to as deflected part depth, may be 5 μm.

In addition, referring to FIG. 3A, the first body 261 is in parallel with the first portion 211 of the data line 21, and the second body 263 is in parallel with the second portion 212 of the data line 21, in embodiments.

Figure 3B:
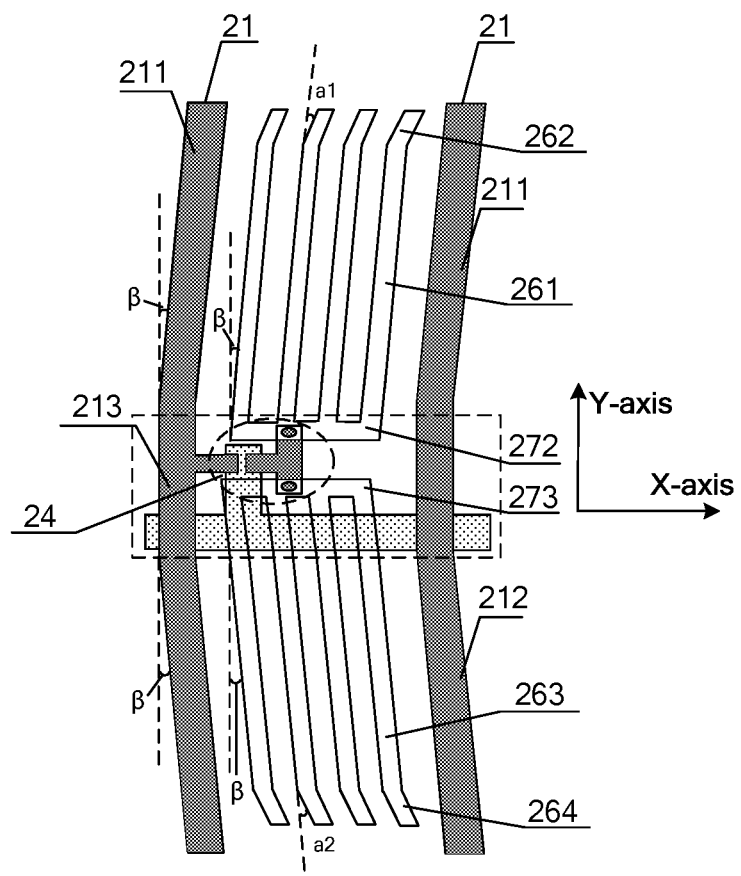
FIG. 3B is a schematic diagram showing the structure of a third array substrate, according to embodiments of the disclosure.

In embodiments of the disclosure, referring to FIG. 3B, each of the first body 261 and the second body 263 is inclined at an angle β from 4° to 30° relative to a second direction, i.e. the direction Y, which is perpendicular to the first direction.

Optionally, the angle β can be no more than 10°. In this case, considering that the first body 261 is in parallel with the first portion 211 of the data line 21, the second body 263 is in parallel with the second portion 212 of the data line 21, and the first connection portion 213 can be arranged to be in parallel with the second direction, the angle β formed between the first portion 211 or the second portion 212 of the data line 21 and the second direction is also no more than 10°. According to an experimental analysis, when the angle formed between the first portion 211 or the second portion 212 of the data line 21 and the second direction is larger than 10°, a scattering phenomenon causing light leak occurs. The relationship between the light leak and the angle β is shown in Table 1 below.

TABLE 1

| Angle | 4° | 10° | 20° | 30° | 40° | 50° | 60° | 70° |
|---|---|---|---|---|---|---|---|---|
| Degree of light leak | 0 | 1 | 2 | 3 | 5 | 5 | 3 | 2 |

As show in Table 1, if the angle β is no more than 10° and connections between various portions of the data line are located at the shielding-light region in embodiments, the light leak phenomenon caused by a corner region formed between the various portions of the data line can be effectively avoided.

Figure 3C:
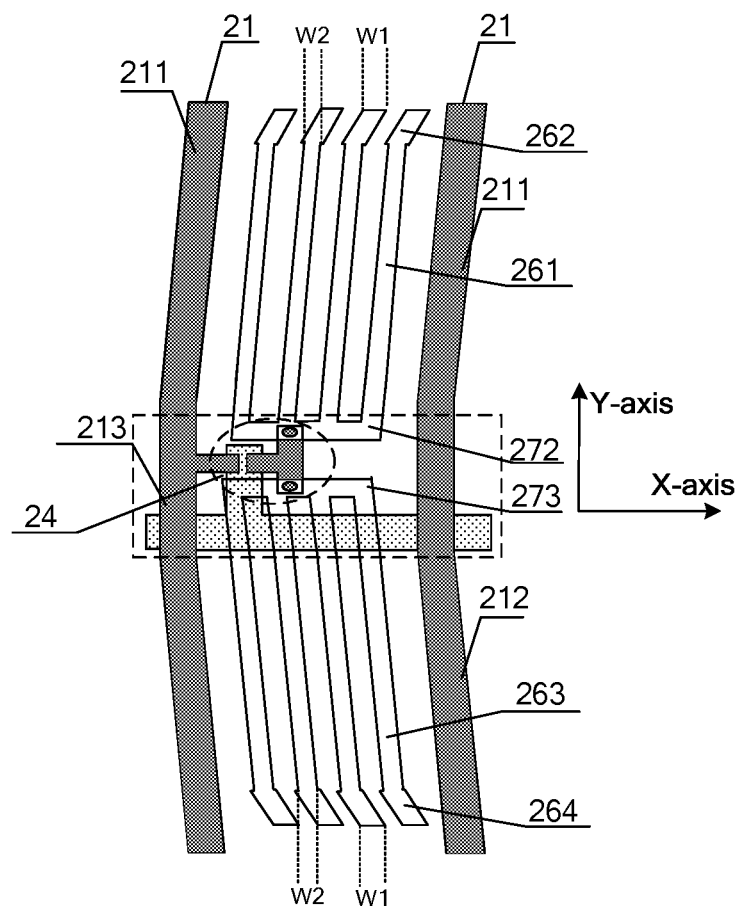
FIG. 3C is a schematic diagram showing the structure of a fourth array substrate, according to embodiments of the disclosure.

Further referring to FIG. 3C, in embodiments, the width W1 of the first deflected part 262 can be larger than the width W2 of the first body 261 in the direction X, and the width W1 of the second deflected part 264 can be larger than the width W2 of the second body 263 in the direction X. Therefore, the intensity of the electric field with the direction X is larger than the intensity of the electric field with the direction Y at each of the first and second deflected parts, and when an external force producing the trace mura phenomenon is removed, a counteracting effect caused by the electric field with the direction Y can be alleviated, thereby accelerating the recovery speed of the liquid crystal molecules and improving the display effect.

Further referring to FIG. 3B, in embodiments, a first angle a1 in a range from 0° to 60° is formed between the first body 261 and the first deflected part 262 of the first strip electrode 253, and a second angle a2 in a range from 0° to 60° is formed between the second body 263 and the second deflected part 264 of the second strip electrode 254. For example, the first angle a1 and the second angle a2 each can be selected as 30°, so that the electric field generated by the first deflected part 262 and the second deflected part 264 in the direction Y can effectively restrain the effect of the trace mura, and a region influenced by the black disclination lines between the second deflected parts 264 will not become too wide.

Figure 4A:
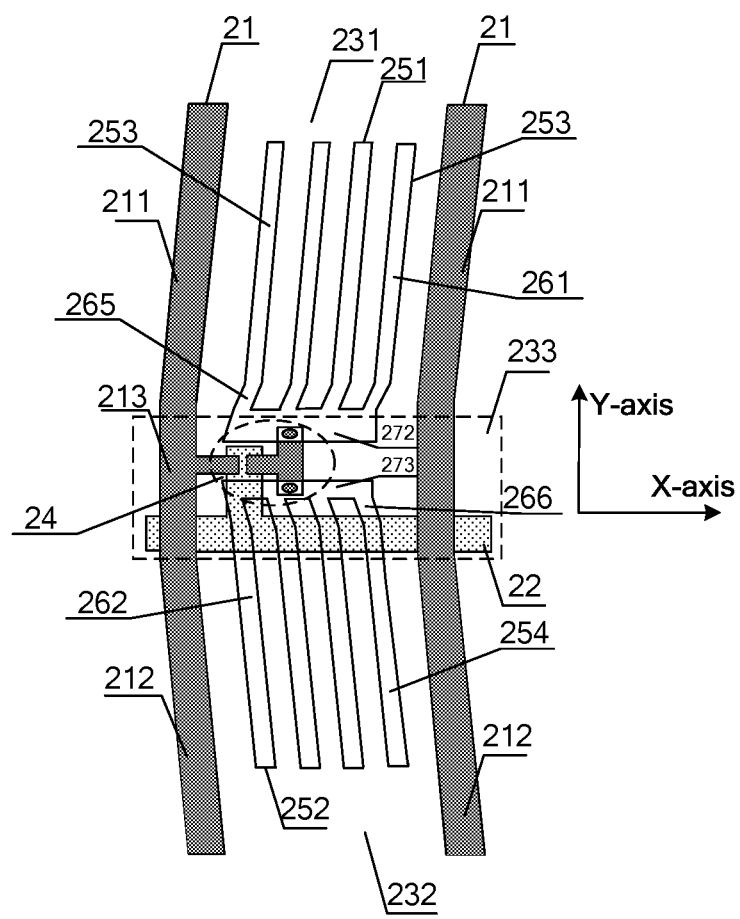
FIG. 4A is a schematic diagram showing the structure of a fifth array substrate, according to embodiments of the disclosure.

Based on the array substrate shown in FIG. 2A, FIG. 4A shows a schematic diagram illustrating the structure of a fifth array substrate, according to embodiments of the disclosure, in which each first strip electrode 253 includes a first body 261 and a third deflected part 265 inclined at a certain angle relative to the first body 261, and the third deflected part 265 is located at an end of the first body 261 that is close to the thin film transistor 24; likewise, each second strip electrode 254 includes a second body 263 and a fourth deflected part 266 inclined at a certain angle relative to the second body 263, and the fourth deflected part 266 is located at an end of the second body 263 that is close to the thin film transistor 24. By such arrangement of the third deflected part 265 and the fourth deflected part 266, the electric field with the direction Y can be effectively utilized to prevent the black disclination lines from extending into regions respectively including the first body 261 and the second body 263, thereby reducing the influence on the display effect by the black disclination lines. In embodiments, the third deflected part and the fourth deflected part have an identical length in the direction Y, which is also referred to as deflected part depth and may be 5 μm.

Figure 4B:
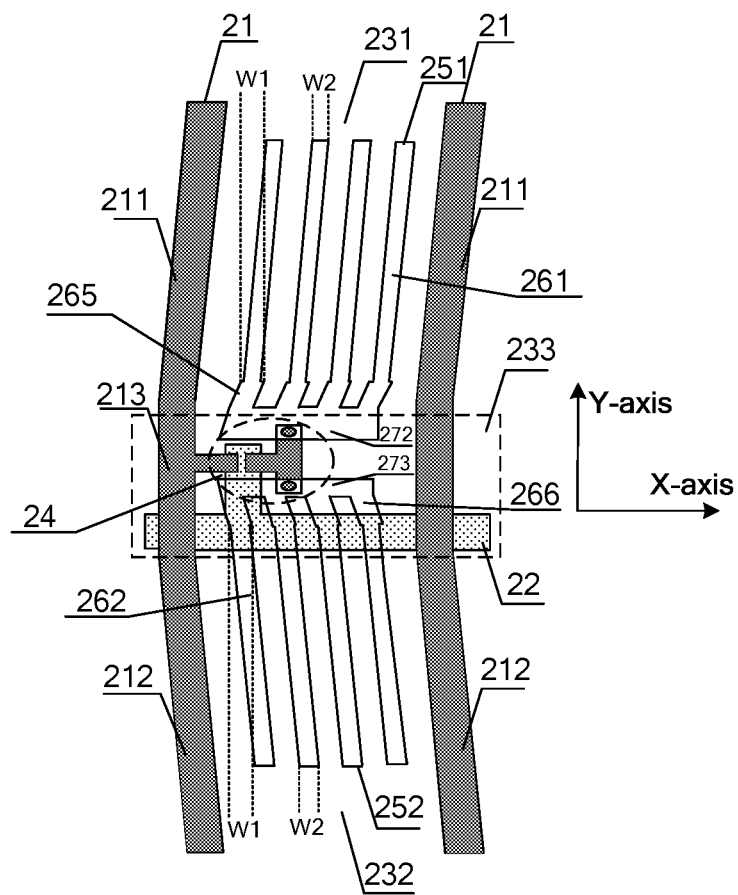
FIG. 4B is a schematic diagram showing the structure of a sixth array substrate, according to embodiments of the disclosure.

In embodiments shown in FIG. 4B, the width W1 of the third deflected part 265 of the first strip electrode 253 can be larger than the width W2 of the first body 261 of the first strip electrode 253, and the width W1 of the fourth deflected part 266 of the second strip electrode 254 can be larger than the width W2 of the second body 263 of the second strip electrode 254, so that the intensity of the electric field with the direction X at the deflected parts is larger than the intensity of the electric field with the direction Y at the deflected parts. When an external force producing the trace mura phenomenon is removed, a counteracting effect caused by the electric field with the direction Y can be alleviated, thereby accelerating the recovery speed of the liquid crystal molecules and improving the display effect.

Figure 4C:
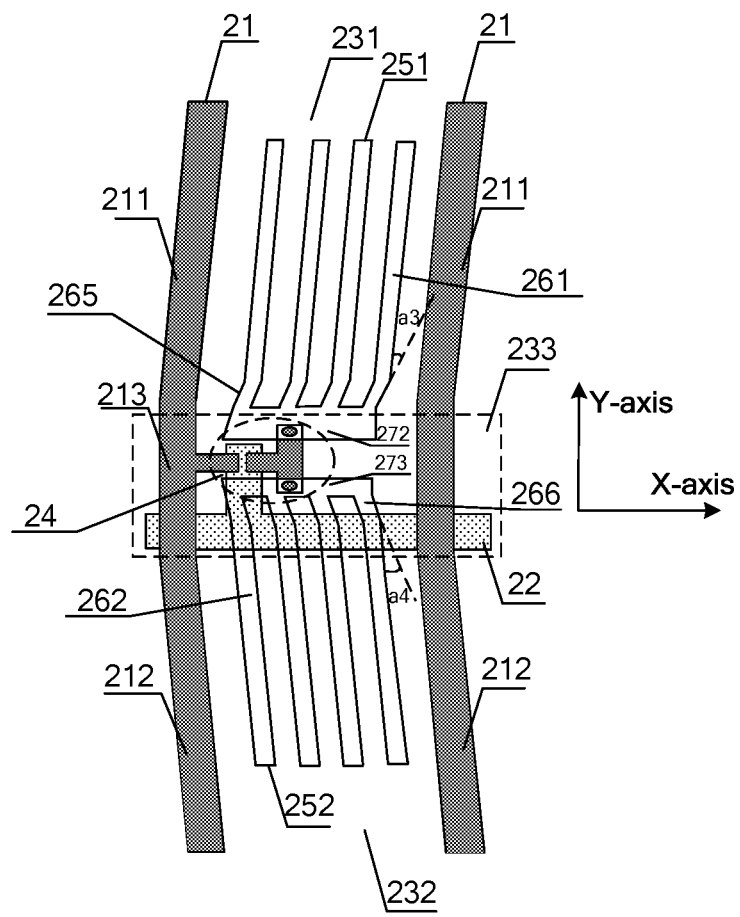
FIG. 4C is a schematic diagram showing the structure of a seventh array substrate, according to embodiments of the disclosure.

Further, referring to FIG. 4C, in embodiments of the disclosure, a third angle a3 in a range from 0° to 60° is formed between the first body 261 and the third deflected part 265 of the first strip electrode 253, and a fourth angle a4 in a range from 0° to 60° is formed between the second body 263 and the fourth deflected part 266 of the second strip electrode 254. For example, the third angle a3 and the fourth angle a4 each can be selected as 30°, so that the electric field generated by the third deflected part 265 and the fourth deflected part 266 in the direction Y can effectively restrain the effect of the trace mura, and a region influenced by the black disclination lines between the third deflected parts 265 will not become too wide.

Figure 5:
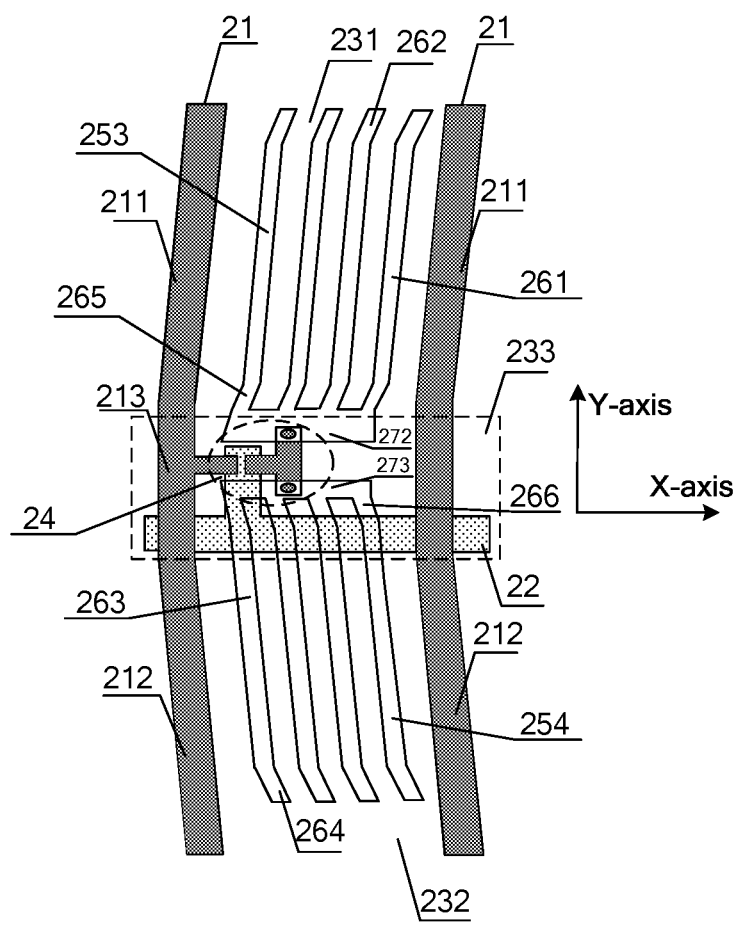
FIG. 5 is a schematic diagram showing the structure of an eighth array substrate, according to embodiments of the disclosure.

As such, in embodiments shown in FIGS. 3A and 4A, the deflected parts are arranged at ends of the first body 261 and the second body 263 that are away from the thin film transistor 24, and at ends of the first body 261 and the second body 263 that are close to the thin film transistor 24. Further, as shown in FIG. 5, deflected parts are arranged at not only the ends of the first body 261 and the second body 263 that are close to the thin film transistor 24, but also at the ends of the first body 261 and the second body 263 that are away from the thin film transistor 24, that is, a first deflected part 262 is disposed at an end of the first body 261 that is away from the thin film transistor 24, a third deflected part 265 is disposed at an end of the first body 261 that is close to thin film transistor 24, a second deflected part 264 is disposed at an end of the second body 263 that is away from the thin film transistor 24, and a fourth deflected part 266 is disposed at an end of the second body 263 that is close to the thin film transistor 24.

As shown in embodiments of FIGS. 2A to 5, the first electrode 251 includes at least two first strip electrodes 253, and ends of the at least two first strip electrodes 253 that are close to the thin film transistor 24 are connected with each other via a second connection portion 272, which is in turn connected with a drain electrode of the thin film transistor 24; likewise, the second electrode 252 includes at least two second strip electrodes 254, and ends of the at least second strip electrodes 254 that are close to the thin film transistor 24 are connected with each other via a third connection portion 273, which is in turn connected with the drain electrode of the thin film transistor 24.

In the above embodiments, the second connection portion 272 and the third connection portion 273 are both connected with the drain electrode of the thin film transistor 24. Of course, in some other embodiments, it is possible that the second connection portion 272 and the third connection portion 273 are connected with each other and are both connected with the drain electrode of the thin film transistor 24.

Figure 6:
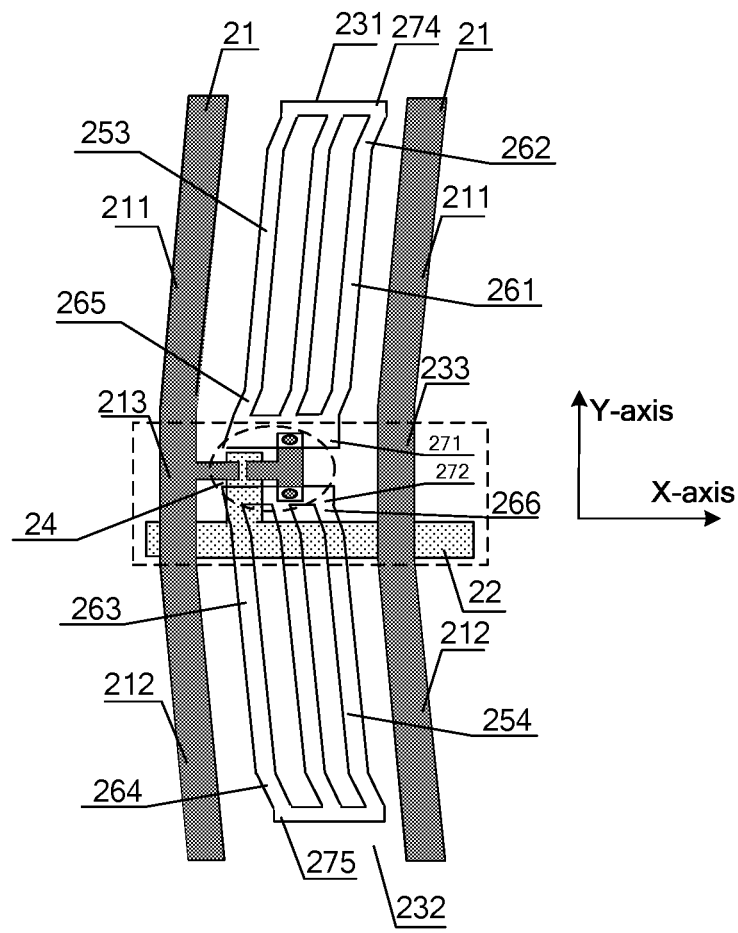
FIG. 6 is a schematic diagram showing the structure of a ninth array substrate, according to embodiments of the disclosure.

Referring to FIG. 6, FIG. 6 is a schematic diagram showing the structure of a ninth array substrate, according to embodiments of the disclosure. The embodiments are different from the embodiments shown in FIGS. 2A to 5 in that ends of the at least two first strip electrodes 253 that are close to the thin film transistor 24 are connected with each other via a second connection portion 272, ends of the at least two second strip electrodes 254 that are close to the thin film transistor 24 are connected with each other via a third connection portion 273, ends of the at least two first strip electrodes 253 that are away from the thin film transistor 24 are connected with each other via a fourth connection portion 274, and ends of the at least two second strip electrodes 254 that are away from the thin film transistor 24 are connected with each other via a fifth connection portion 275. As shown, the first electrode has three first strip electrodes 253 and the second electrode also has three second strip electrodes 254.

Regarding the array substrate shown in FIG. 6, in embodiments of the disclosure, the time taken for the trace mura in the array substrate to disappear after the external force producing the trace mura phenomenon is removed (which is referred to as recovery time for short) is tested by experiments. Meanwhile, the time taken for the trace mura in the array substrate of the prior art shown in FIG. 1 to disappear after the external force producing the trace mura phenomenon is removed is also tested by the experiments for comparison. Two samples are provided for the comparison shown in Table 2 below.

TABLE 2

| Angles | Recovery time in present disclosure | | Recovery time in the prior art | |
| --- | --- | --- | --- | --- |
| | Sample 1 | Sample 2 | Sample 1 | Sample 2 |
| 4° | 0.79 | 0.67 | 1.8 | 1.7 |
| 5° | 0.75 | 0.67 | 1.04 | 0.75 |
| 6° | 0.67 | 0.58 | 0.79 | 0.67 |
| 7° | 0.63 | 0.54 | 1.04 | 0.67 |

In Table 2, the angle represents an angle formed between the first body 261 of the first strip electrode and the second direction (i.e. the direction Y) or an angle between the second body 263 of the second strip electrode and the second direction (i.e. the direction Y), and the recovery time is represented in the unit of second. According to the technical solutions of the embodiments of the disclosure, when the recovery time for the trace mura phenomenon is shortened, the trace mura phenomenon can be effectively alleviated.

Figure 7:
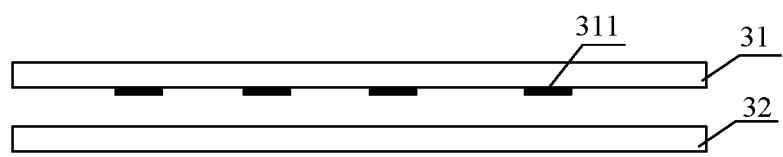
FIG. 7 is a schematic diagram showing the structure of a liquid crystal display panel, according to embodiments of the disclosure.

Embodiments of the disclosure also provide a liquid crystal display panel. Referring to FIG. 7 which is a schematic diagram showing the structure of a liquid crystal display panel, according to embodiments of the disclosure, the liquid crystal display panel includes a color filter substrate 31 and an array substrate 32 opposite to the color filter substrate 31, where the array substrate 32 is one according to any one of the embodiments mentioned above.

A black matrix 311 is disposed on the color filter substrate 31, and the black matrix 311 is disposed correspondingly to data lines and scan lines on the array substrate 32 and a light shielding region in each pixel region on the array substrate 32, so that each light shielding region on the array substrate is located within a projection of the black matrix 311 onto the array substrate 32.

Further, in some embodiments, the third deflected part of the first strip electrode is at least partially located within the projection of the black matrix onto the array substrate; and/or the fourth deflected part of the second strip electrode is at least partially located within the projection of the black matrix onto the array substrate.

In embodiments of the disclosure, the black matrix shields the third deflected part and the fourth deflected part so as to effectively reduce the number of black disclination lines.

Since a region including the black disclination lines has an insignificant effect on the light transmissibility of each pixel region, the overall light transmissibility of the pixel region is basically dependent on the light transmissibility of a part of the pixel region at which a body of each strip electrode is located. Meanwhile, with the technical solutions of the disclosure, the overall light transmissibility of each pixel region is almost not affected, that is, the overall light transmissibility of each pixel region basically remains unchanged as compared with the prior art.

In addition, referring to FIG. 6 again, in some embodiments of the disclosure, the fourth connection portion 274 can be located within the projection of the black matrix onto the array substrate; and/or the fifth connection portion 275 can be located within the projection of the black matrix onto the array substrate. In this way, a region with black disclination lines caused by the fourth connection portion 274 and the fifth connection portion 275 can be effectively shielded.

It should be noted that the embodiments of the disclosure and the technical principles used therein are described as above. It should be appreciated that the disclosure is not limited to the particular embodiments described herein, and any apparent alterations, modification and substitutions can be made by those skilled in the art without departing from the scope of protection of the disclosure. Accordingly, while the disclosure is described in detail through the above embodiments, the disclosure is not merely limited to the above embodiments and can further include other additional embodiments without departing from the scope of the disclosure Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. An array substrate, comprising:
   data lines;
   scan lines intersecting the data lines; and
   a plurality of pixel regions;
   wherein each of the plurality of pixel regions comprises a first light transmission region, a second light transmission region and a light shielding region between the first light transmission region and the second light transmission region, a first electrode is disposed in the first light transmission region, a second electrode is disposed in the second light transmission region, and a thin film transistor is disposed in the light shielding region, wherein a drain electrode of the thin film transistor is electrically connected with the first electrode and the second electrode;
   the data line corresponding to each of the plurality of pixel regions comprise a first portion and a second portion extending in two different directions, respectively, the first portion is connected with the second portion via a first connection portion located at the light shielding region, each of a first data line angle formed between the first portion and the first connection portion and a second data line angle formed between the second portion and the first connection portion is greater than 0°, and the scan line corresponding to each of the plurality of pixel regions extends through the light shielding region;
   the first electrode comprises at least one first strip electrode and the second electrode comprises at least one second strip electrode, wherein the at least one first strip electrode is disposed corresponding to the at least one second strip electrode, respectively; and
   a first strip electrode comprises a first body and a first deflected part inclined at a first angle relative to the first body, and the first deflected part is located at an end of the first body that is away from the thin film transistor; a second strip electrode comprises a second body and a second deflected part inclined at a second angle relative to the second body, and the second deflected part is located at an end of the second body that is away from the thin film transistor.

2. The array substrate of claim 1, wherein the scan line is configured to extend in a first direction, and the first portion and the second portion of the data line are symmetrical with respect to the first direction.

3. The array substrate of claim 2, wherein the first electrode and the second electrode are symmetrical with respect to the first direction.

4. The array substrate of claim 1, wherein the first body is in parallel with the first portion of the data line, and the second body is in parallel with the second portion of the data line.

5. The array substrate of claim 1, wherein the first direction is perpendicular to a second direction, and an angle formed between the first body and the second direction and an angle formed between the second body and the second direction each are in a range from 4° to 30°.

6. The array substrate of claim 1, wherein a width of the first deflected part of the first strip electrode is larger than that of the first body, and a width of the second deflected part of the second strip electrode is larger than that of the second body.

7. The array substrate of claim 1, wherein the first angle and the second angle each range from 0° to 60°.

8. The array substrate of claim 1, wherein the first strip electrode further comprises a third deflected part inclined at a third angle relative to the first body, and the third deflected part is located at an end of the first body that is close to the thin film transistor; the second strip electrode further comprises a fourth deflected part inclined at a fourth angle relative to the second body, and the fourth deflected part is located at an end of the second body that is close to the thin film transistor.

9. The array substrate of claim 8, wherein a width of the third deflected part of the first strip electrode is larger than that of the first body, and a width of the fourth deflected part of the second strip electrode is larger than that of the second body.

10. The array substrate of claim 8, wherein the third angle and the fourth angle each range from 0° to 60°.

11. The array substrate of claim 1, wherein the first electrode comprises at least two first strip electrodes, and ends of the at least two first strip electrodes that are close to the thin film transistor are connected with each other via a second connection portion, which is in turn connected with the drain electrode of the thin film transistor; the second electrode comprises at least two second strip electrodes, ends of the at least two second strip electrodes that are close to the thin film transistor are connected with each other via a third connection portion, which is in turn connected with the drain electrode of the thin film transistor.

12. The array substrate of claim 11, wherein ends of the at least two first strip electrodes that are away from the thin film transistor are connected with each other via a fourth connection portion; and ends of the at least two second strip electrodes that are away from the thin film transistor are connected with each other via a fifth connection portion.

13. A liquid crystal display panel, comprising:
a color filter substrate;
an array substrate opposite to the color filter substrate, wherein the array substrate comprises:
data lines;
scan lines intersecting the data lines; and
a plurality of pixel regions;
wherein each of the plurality of pixel regions comprises a first light transmission region, a second light transmission region and a light shielding region between the first light transmission region and the second light transmission region, a first electrode is disposed in the first light transmission region, a second electrode is disposed in the second light transmission region, and a thin film transistor is disposed in the light shielding region, wherein a drain electrode of the thin film transistor is electrically connected with the first electrode and the second electrode;
the data line corresponding to each of the plurality of pixel regions comprise a first portion and a second portion extending in two different directions, respectively, the first portion is connected with the second portion via a first connection portion located at the light shielding region, each of a first data line angle formed between the first portion and the first connection portion and a second data line angle formed between the second portion and the first connection portion is greater than 0°, and the scan line corresponding to each of the plurality of pixel regions extends through the light shielding region;
the first electrode comprises at least one first strip electrode and the second electrode comprises at least one second strip electrode, wherein the at least one first strip electrode is disposed corresponding to the at least one second strip electrode, respectively; and
a first strip electrode comprises a first body and a first deflected part inclined at a first angle relative to the first body, and the first deflected part is located at an end of the first body that is away from the thin film transistor; a second strip electrode comprises a second body and a second deflected part inclined at a second angle relative to the second body, and the second deflected part is located at an end of the second body that is away from the thin film transistor.

14. The liquid crystal display panel of claim 13, wherein a black matrix is disposed on the color filter substrate, and each light shielding region on the array substrate is located within a projection of the black matrix onto the array substrate.

15. The liquid crystal display panel of claim 14, wherein the first electrode comprises at least one first strip electrode and the second electrode comprises at least one second strip electrode, wherein the at least one first strip electrode is disposed corresponding to the at least one second strip electrode, respectively;
a first strip electrode comprises a first body and a first deflected part inclined at a first angle relative to the first body, and the first deflected part is located at an end of the first body that is away from the thin film transistor; and
a second strip electrode comprises a second body and a second deflected part inclined at a second angle relative to the second body, and the second deflected part is located at an end of the second body that is away from the thin film transistor;
the first strip electrode further comprises a third deflected part inclined at a third angle relative to the first body, and the third deflected part is located at an end of the first body that is close to the thin film transistor;
the second strip electrode further comprises a fourth deflected part inclined at a fourth angle relative to the second body, and the fourth deflected part is located at an end of the second body that is close to the thin film transistor; and
at least one of the third deflected part of the first strip electrode is at least partially located within the projection of the black matrix onto the array substrate, and the fourth deflected part of the second strip electrode is at least partially located within the projection of the black matrix onto the array substrate.

16. The liquid crystal display panel of claim 14, wherein the first electrode comprises at least one first strip electrode and the second electrode comprises at least one second strip electrode, wherein the at least one first strip electrode is disposed corresponding to the at least one second strip electrode, respectively;
a first electrode comprises at least two first strip electrodes, ends of the at least two first strip electrodes that are close to the thin film transistor are connected with each other via a second connection portion, which is in turn connected with the drain electrode of the thin film transistor;
a second electrode comprises at least two second strip electrodes, ends of the at least two second strip electrodes that are close to the thin film transistor are connected with each other via a third connection portion, which is in turn connected with the drain electrode of the thin film transistor;
ends of the at least two first strip electrodes that are away from the thin film transistor are connected with each other via a fourth connection portion and ends of the at least two second strip electrodes that are away from the thin film transistor are connected with each other via a fifth connection portion; and
at least one of the fourth connection portion is located within the projection of the black matrix onto the array substrate, and/or the fifth connection portion is located within the projection of the black matrix onto the array substrate.

17. The array substrate of claim 1, wherein the angle formed between the first portion and the first connection portion and the angle formed between the second portion and the first connection portion are each in a range from 4° to 30°.

* * * * *